United States Patent [19]
Jeon et al.

[11] Patent Number: 5,922,513
[45] Date of Patent: *Jul. 13, 1999

[54] ILLUMINATION METHOD AND APPARATUS FOR THE FORMATION OF MICRO PATTERNS

[75] Inventors: Seong Ho Jeon; Sung Muk Lee; Bae Doo Cho, all of Ichon-shi, Rep. of Korea

[73] Assignee: Hyundai Electronics Industries Co., Ltd., Ichon-shi, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/762,242

[22] Filed: Dec. 9, 1996

[30] Foreign Application Priority Data

Dec. 8, 1995 [KR] Rep. of Korea ............... 95-48047

[51] Int. Cl.⁶ ............... G03C 5/00; G02F 1/01
[52] U.S. Cl. ............... 430/311; 430/325; 250/225
[58] Field of Search ............... 430/311, 325; 250/225

[56] References Cited

U.S. PATENT DOCUMENTS

| | | | |
|---|---|---|---|
| 5,004,321 | 4/1991 | Feldman et al. | 350/320 |
| 5,053,628 | 10/1991 | Yamamoto et al. | 250/557 |
| 5,078,482 | 1/1992 | Feldman et al. | 359/371 |
| 5,283,141 | 2/1994 | Yoon et al. | 430/30 |
| 5,338,630 | 8/1994 | Yoon et al. | 430/30 |
| 5,365,371 | 11/1994 | Kamon | 359/483 |
| 5,541,026 | 7/1996 | Matsumoto | 430/5 |

FOREIGN PATENT DOCUMENTS

| | | |
|---|---|---|
| 2232917 | 9/1990 | Japan . |
| 2 217 567 | 4/1984 | United Kingdom . |
| WO 95/35506 | 12/1995 | WIPO . |

*Primary Examiner*—Janet Baxter
*Assistant Examiner*—Rosemary Ashton
*Attorney, Agent, or Firm*—Thelen Reid & Priest LLP

[57] ABSTRACT

The illumination method and apparatus used to form micro patterns, which can determine an ellipticity exhibiting optimum contrast gap and contrast by deriving a polarization distribution function by use of equations induced in accordance with the vector image theory and deriving S and P-polarized components ($S_{com}$ and $P_{com}$) (these components are perpendicular to and parallel to a meridional plane, respectively) of polarized light having x and y-directional components entering an illumination mask, thereby, preventing a contrast difference resulting from a contrast gap generated in the conventional linear polarization method, namely, an inconsistency between the longitudinal direction of the pattern and the polarization direction. Accordingly, it is possible to easily use appropriately elliptically polarized light, thereby being capable of achieving a reduction in contrast gap while achieving an improvement in contrast. The illumination method and apparatus can easily form micro patterns in the fabrication of semiconductor devices, thereby achieving a high integration of semiconductor devices. It is also possible to increase the process margin, thereby improving yield and reliability.

2 Claims, 6 Drawing Sheets

ILLUMINATION METHOD AND APPARATUS FOR THE FORMATION OF MICRO PATTERNS

BACKGROUND OF THE INVENTION

1. Field of the Invention

The present invention relates to a method for forming micro patterns of a semiconductor device, and more particularly to the illumination method and apparatus used to form such micro patterns.

2. Description of the Prior Art

The recent trend to fabricate highly integrated semiconductor devices has been greatly affected by the development of techniques of forming patterns having a micro dimension. Photoresist film patterns formed by a photolithography process are widely used as masks for carrying out an etch process or ion implantation process in the fabrication of semiconductor devices.

A method for reducing the wavelength of light emitted from a light source is known to improve the resolution of a stepper.

For example, steppers using an i-line laser having a wavelength of 365 nm as a light source have a resolution capable of forming patterns having line/space dimensions of about 0.5 $\mu$m. Steppers using the KrF laser having a wavelength of 248 nm or the ArF laser having a wavelength of 193 nm as a light source have a resolution capable of forminq patterns having line/space dimensions of about 0.25 $\mu$m.

In order to form micro patterns, a method has been proposed which uses a phase shift mask utilizing an optical interference between neighboring patterns. A polarized beam illumination method also exists and uses a polarized beam from the light source of a stepper.

Where a photoresist film pattern with a desired structure is formed on a wafer using the lithography process, illumination is carried out using a mask having a desired light shielding pattern, for example, a reticle.

In this connection, a conventional illumination method used in the formation of micro patterns will now be described in conjunction with FIG. 1.

Figure 1:
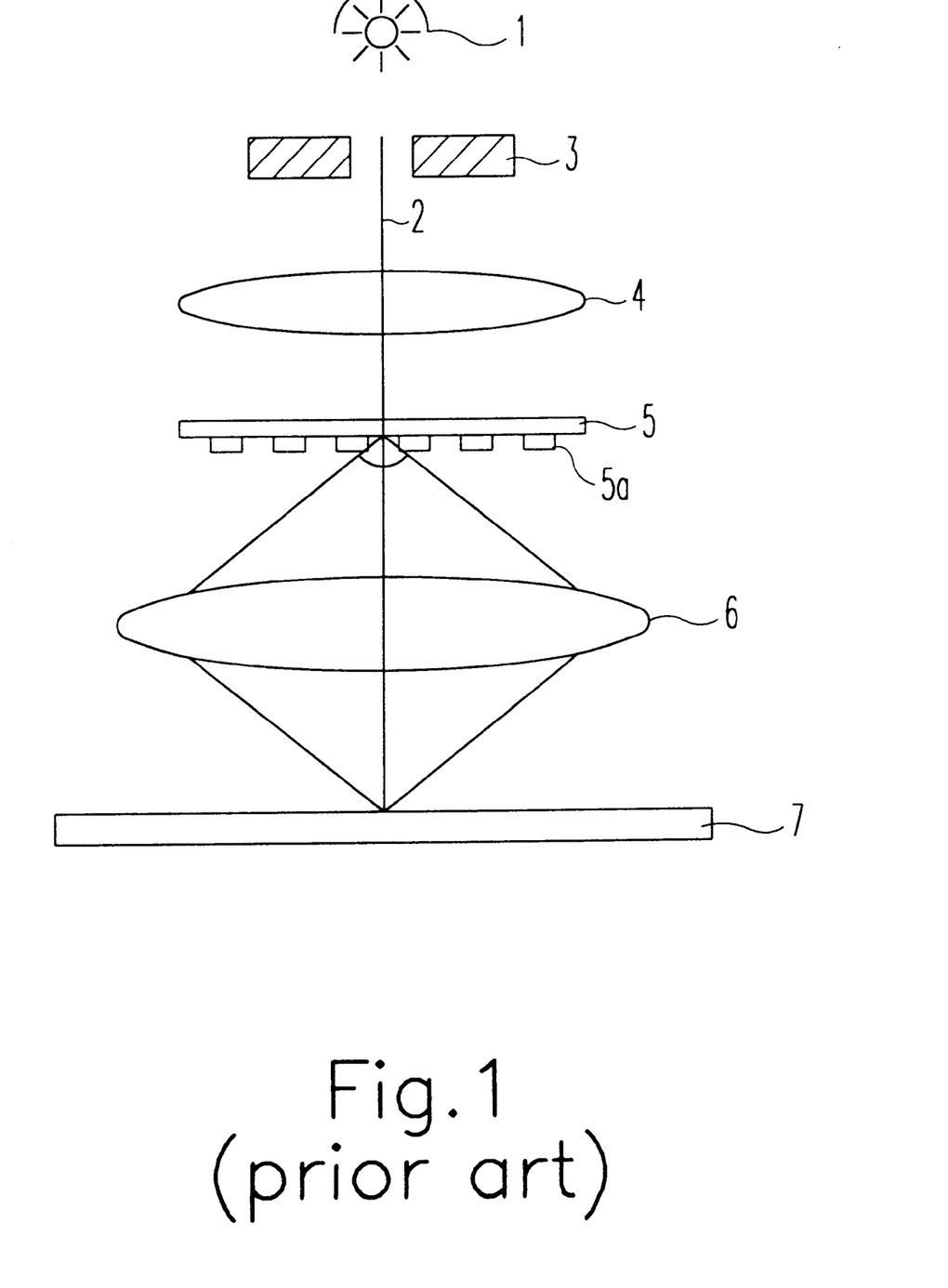
FIG. 1 is a schematic view illustrating the construction of a stepper used to carry out a general illumination method.

FIG. 1 is a schematic view illustrating the construction of a stepper used to carry out a general illumination method. The illumination method is the Kohler illumination method.

As shown in FIG. 1, the stepper includes a light source 1. A light beam 2 emitted from the light source 1 passes through an aperture 3 and a condensing lens system 4. The light beam 2 emerging from the condensing lens system 4 then passes through an illumination mask 5 provided with a light shielding pattern 5a, thereby forming an image. The light beam 2 then passes through a projection lens system 6 and reaches a wafer 7.

In accordance with the illumination method wherein illumination is carried out through the above-mentioned optical path, the time taken for illumination is short. However, a problem in that a reduction in yield occurs because the depth4 of focus is small.

In order to solve this problem, a modified illumination method has also been proposed which uses an aperture having a modified shape in such a manner that a light shielding portion is provided at the central portion of the aperture, thereby allowing light to be slantly incident on an illumination mask. In accordance with this method, two light beams diffracted by the illumination mask, namely, the 0th diffracted light beam and the +1'st or −1'st diffracted light beam are condensed on a projection lens disposed beneath the illumination mask. When the 0th and ±1'st diffracted light beams have the same incident angle, the depth of focus may be increased.

In accordance with this method, the light shielding portion of the aperture serves to shield light beams incident on the central portion of the aperture. As a result, light reaching the illumination mask and wafer exhibits a low intensity as compared to that in the above-mentioned general illumination method. For this reason, it is necessary to perform the illumination for a lengthened period in accordance with the modified illumination method, as compared to the general illumination method. This results in a degradation in yield.

In order to solve this problem, various methods have been proposed. For example, there is a linearly polarized beam illumination method wherein light emitted from a light source is linearly polarized in a desired direction. In accordance with this method, it is possible to form an image having a line/space width of up to 0.175 $\mu$m using an illumination mask having a light shielding film pattern parallel to the polarization direction even when a stepper using an i-line light source is used. However, where an illumination mask having a light shielding film pattern perpendicular to the polarization is used, a degradation in the contrast of the image occurs. In other words, a contrast gap exists.

In cases using the conventional illumination utilizing linearly polarized beams, off-axis illumination or phase shift mask, a high contrast is exhibited when the main axis of linearly polarized beams are parallel to the light shielding film pattern of the illumination mask ($S_{com}$ components of incident light at an angle of polarization $\chi$ corresponding to 90°), as compared to the case wherein the main axis of linearly polarized beams are parallel to the light shielding film pattern of the illumination mask ($P_{com}$ components of incident light at an angle or polarization $\chi$ corresponding to 0°). As a result, a contrast gap exists between the above-mentioned two components of the incident light. Thus, such a contract gap exists in all cases using the conventional illumination, off-axis illumination and phase shift mask.

The contrast gap increases as the partial interference degree $\sigma$, namely, the ratio between the transmission area of the aperture and the entire area of the aperture and the feature size decrease. The contrast gap also increases as the numerical aperture increases. Such a contrast gap also increases when the off-axis illumination or phase shift mask is used.

Since a large contrast gap exists when using the conventional illumination method for forming micro patterns, it is difficult to form micro patterns of illumination masks oriented in various directions using the linearly polarized beam illumination method. As a result, it is difficult to achieve a high integration of semiconductor devices.

For this reason, the conventional illumination methods for forming micro patterns involve a reduced process margin, thereby decreasing process yield and reliability.

SUMMARY OF THE INVENTION

Therefore, an object of the invention is to solve the above-mentioned problems involved in the prior art and to provide the illumination method and apparatus used to form micro patterns, which are capable of reducing the contrast gap while obtaining a high contrast, thereby achieving a high integration of semiconductor devices.

Another object of the invention is to provide an illumination method and apparatus capable of increasing the process margin, thereby improving yield and reliability.

Another object of the invention is to provide an illumination method and apparatus capable of easily forming micro patterns in the fabrication of semiconductor devices.

In accordance with one aspect of the present invention, an illumination method is provided for forming a pattern on a wafer by irradiating an image on to the wafer via a light source, wherein polarized light is used as the light source, the polarized light has an ellipticity and an angle of polarization, which provides a contrast gap allowed by a process margin.

In accordance with another aspect of the present invention, an illumination apparatus is provided for forming a pattern on a wafer by irradiating an image on to the wafer via a light source, comprising: a polarization plate for polarizing light irradiated from the light source so that the light can have a desired ellipticity and a desired angle of polarization.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

In accordance with the present invention, polarized light having an elliptical pattern including a circular pattern is used in the formation of micro patterns. In order to explain the theoretical base of the use of such polarized light, a polarization distribution function and polarized beam components based on the polarization distribution function will be described in brief.

Light incident on an object plane in a direction $(L_x, L_y)$ corresponding to directional unit vectors $t_x$ and $t_y$ passes through a mask. The incident light is diffracted in a direction $(r_x, r_y)$ while passing through the mask.

The diffracted light then passes through a projection lens system. The light emerging from the exit pupil of the projection lens system advances to a Gaussian image point in a direction $(s_x, s_y)$ and generates electric field on an image plane defined by an x-y coordinate system.

The electric field can be expressed by the following equation (1):

$$E(x, y, t_x, t_y) = 1/(i\lambda) \int \int_A F(r_x - t_x, r_y - t_y) \times \qquad (1)$$
$$K(S_x, S_y; t_x, t_y) \exp\{i2\pi(s_x x + s_y y)/\lambda\} ds_x ds_y$$

In the above equation, $A=(s_x^2+s_y^2)^{1/2} \leq NA$. Also, "$F(r_x-t_x, r_y-t_y)$" is a Fourier transformation of the mask transmission function. "$K(S_x,S_y;t_x,t_y)$" is a vector transfer function. Along with the "$F(r_x-t_x, r_y-t_y)$", the "$K(S_x,S_y;t_x,t_y)$" determines the amplitude of light advancing in a direction $(S_x,S_y)$ after being incident on the object plane in the direction $(t_x,t_y)$ and passing through the projection lens system.

In other words, the electric field on the image plane has an amplitude corresponding to "$F(r_x-t_x, r_y-t_y) \times K(S_x,S_y;t_x,t_y)$". The electric field is a superposition of plane waves advancing in the direction $(S_x,S_y)$.

However, the vector transfer function "$K(S_x,S_y;t_x,t_y)$" has a value which is barely influenced by the entrance-directional components $t_x$ and $t_y$. This vector transfer function has an approximation value expressed by the following equation (2):

$$K(S_x,S_y;t_x,t_y) \approx K(S_x,S_y;0,0) \approx K(S_x,S_y) \qquad (2)$$

An approximation vector transfer function serving to transmit a spatial frequency of the mask to the image plane is defined by the following equation (3):

$$K(S_x, S_y) = \{(1/\cos\alpha\cos\beta)^{1/2} \Psi(s_x, s_y) \exp\{i2\pi\phi(s_x + s_y)/\lambda\} \qquad (3)$$
$$(\text{when } s_x^2 + s_y^2 \leq NA^2)$$
$$= 0 \text{ (otherwise)}$$

where, "$\cos\alpha$" is a directional component of the diffracted light passing through the mask with respect to the optical axis, and "$\cos\beta$" is a directional component of the light passing through the projection lens system with respect to the optical axis.

These directional components can be expressed by the following equations (4A) and (4B):

$$\cos\alpha = r_2 = (1-r^{x2}-r^2_y)^{1/2} \qquad (4A)$$
$$\cos\beta = s_2 = (1-s^{x2}-s^2_y)^{1/2} \qquad (4B)$$

In the equation (3), "$\phi(S_x,S_y)$" is a wavefront aberration function established while light passes through the projection lens system whereas "$\psi(S_x,S_y)$" is a polarization distribution function having a value indicative of the contribution of the light coming in parallel to the optical axis to the diffracted light passing through the exit pupil.

Meanwhile, where the partial interference degree σ is associated with the partially interfering illumination, the $(t_x,t_y)$ region indicative of the direction of light incident on the mask is an effective region formed at the entrance pupil.

Accordingly, the luminous intensity on the image plane can be derived by using the following integration executed at the effective region for the direction $(t_x,t_y)$:

$$I(x,y) = \int\int_B \Gamma(t_x,t_y) |E(x,y;t_x,t_y)|^2 dt_x dt_y - \Sigma_{k=x,y,z} \int\int_B (t_x,t_y) E^2_k(x,y;t_x, t_y) dt_x dt_y \qquad (5)$$

where, $B=(t_x^2+t_y^2)^{1/2} \leq \sigma NA$, and the integration region is indicative of the size of the effective source formed at the entrance pupil of the Kohler illumination system.

In the above equation, "$\Gamma(t_x,t_y)$" is a value indicative of the weighing function of the incident light distribution. In the case of the Kohler illumination system, "$\Gamma(t_x,t_y)$" is indicative of the size of a light source formed on the mask plane.

The light distribution on the image plane can be calculated using the above-mentioned equations (1) to (5), as follows:

$$I(x,y)=\Sigma_{k=x,y,z}\int\int\Gamma(t_x,t_y)[\{1/(i\lambda)\}\int\int F(r_x-t_x,r_y-t_y)\times k_k(s_x,s_y)\exp\{i(2\pi/\lambda)(\Im_x x+\Im_y y)\}d\Im_x d\Im_y\}]^2 dt_x dt_y$$

$$I(x, y) = \sum_{k=x,y,z} (-1/\lambda^2) \int\int\int\int d s_x d s_y d s'_x d s'_y \times \qquad (6)$$

$$\int\int \Gamma(t_x, t_y) K_k(S_x, S_y) K_k^*(S'_x, S'_y) \times$$

$$\exp\{i(2\pi/\lambda)(s_x - s'_x)x + (s_y y - s'_y)y\}] F(r_x - t_x, r_y - t_y) \times$$

$$F^*(r_x - t_x, r_y - t_y) d t_x d t_y$$

where, "★" represents a complex conjugate.

In order to calculate the above equation, directional components on the object plane are substituted by directional components on the image plane, as follows:

$$(t_x,t_y)=(-Mu_x,-Mu_y),(r_x,r_y)=(-ms_x-Ms_y)$$

where, "M" represents the magnification of the projection lens system, and "$(u_x,u_y)$" and "$(s_x,s_y)$" represent variations of directional components when the $(t_x,t_y)$ and $(r_x,r_y)$ directional components pass through the projection lens system.

Accordingly, the following equation is established:

$$I(x, y) = \sum_{k=x,y,z} \int\int\int\int d s_x d s_y d s'_x d s'_y \times \qquad (7)$$

$$\int\int \Gamma(-Mu_x - Mu_y) K_k(S_x, S_y) K_k(S'_x, S'_y) \times$$

$$\exp[i(2\pi/\lambda)\{(s_x - s'_x)x + (s_y y - s'_y)y\}] F(-Ms_x + Mu_x, -Ms_y +$$

$$Mu_y) \times F(-Ms'_x + Mu_x, -Ms_y + Mu_y) d u_x d u_y$$

The equation (7) is expressed in the form of an integration equation with respect to a spatial frequency generated from the diffracted light emerging from the mask when the light passes through the projection lens system, aa follows:

$$(f, g) = (-u_x/\lambda, -u_x/\lambda) \qquad (8)$$

$$(f', q') = ((-s_x + u_x)/\lambda, (-s_y + u_y)/\lambda)$$

$$(t, g) = ((-s_x + u_x)/\lambda, (-s_y + u_y)/\lambda)$$

Therefore, the integration equation relating to directional components in the light distribution of the equation (7) can be changed into the integration expression relating to the spatial frequency, as follows:

$$I(x, y) = \qquad (9)$$

$$\sum_{k=x,y,z} \int\int\int\int TCC_k(f', g':f'', g'') \times F(Mf', Mg')F^*(Mf'', Mg'') \times$$

$$\exp\{i(2\pi/\lambda)\{(f' - f'')x + (g' - g'')y\}] d f' d g' d f'' d g''$$

where, "$TCC_k(t',g':t'',g'')$" represents the k-directional component of a vector transmission cross coefficient (TCC).

The "$TCC_k(f',g',f'',g'')$" can be calculated as follows:

$$TCC_k(f',g',f'',g'')=\int\int\Gamma(Mf,Mg)\times K_k(f+f',g+g')K^-_k(f'+f'',g'+g'')dfdg$$

"F(Mf,Mg')" in the equation (9) can be expressed in the form of "F(f,g')" by transforming the coordinates of the mask itself from "(x,y)" to "(x/M,y/M)" to perform a Fourier calculation.

Since the integration region of "$\Gamma(Mf,Mg)$" is a circle having a radius corresponding to $\sigma NA_{im}=\sigma MNA_{ob}$ in an image space, the result as mentioned above can be obtained by expressing "$\Gamma(Mf,Mg)$" in the form of "$\Gamma(f,g)$" and then changing the integration region into that for the radius of $\sigma NA_{ob}$ in an object space.

Therefore, the luminous intensity of an aerial image on the image plane can be calculated in the form of the integration of a standardized spatial frequency as follows:

$$I(x, y) = \sum_{k=x,y,z} \int\int\int\int TCC_k(f', q':f'', g'') \times F(f', g')F^*(f'', g'') \times$$

$$\exp[i(2\pi/\lambda)\{(s_x - s'_x)x + (s_y y - s'_y)y\}] d f' d g' d f'' d g''$$

where, "(f,g')" and "(f'',g'')" are spatial frequencies standardized by "NA/λ", "F(f,g')" represents a Fourier transformation of the mask transmission function, and "F★" represents a complex conjugate of F.

In the above equation, "$TCC_k(f',g':f'',g'')$" represents the k-directional component of a vector TCC. That is, "$TCC_k(f',g',f'',g'')$" is a characteristic value of the optical system irrespective of the light shielding film pattern of the illumination mask. This value can be calculated as folLows:

$$TCC_k(f',g',f'',g'')=\int\int(f,g)\times K_k(f+f',g+g')\times K_k(f'+f'',g'+g'')dfdg \qquad (11)$$

In the equation (11), "$\Gamma(f,g)$" is a value indicative of an effective source of the illumination system formed at the entrance pupil. In the case of a circular illumination, "$\Gamma(f,g)$" has the following value:

$$\Gamma(f, g) = 1/\pi\sigma^2 \quad (\text{when } f^2 + g^2 < \sigma^2) \qquad (12)$$

$$= 0 \quad (\text{otherwise})$$

On the other hand, "K(f,g)" is a vector transfer function which is newly defined by the vector diffraction theory. This vector transfer function is defined as follows:

$$K_k(f, g) = C\Psi_k(f, g)\exp\{i(2\pi/\lambda)\phi(f, g)\} \quad (\text{when } f^2 + g^2 \le 1) \qquad (13)$$

$$= 0 \quad (\text{otherwise})$$

In the equation (13), "C" represents a value at which optical energy can be reserved between the object plane and image plane. This "C" can be calculated by the following equation:

$$C = \{1 - \lambda^2(1+M^2)(f^2+g^2) + \lambda^4(f^2+f^2)^2\}^{-1/2}$$

Meanwhile, "φ(x,y)" is a wavefront aberration function including a defocus of the projection lens system.

The polarization distribution function $\psi_k(f,g)$ is a value indicative of the contribution of the polarization component of the incident light to the k-directional component of the diffracted light emerging from the optical system and advancing from the exit pupil in a direction (λf,λg).

Figure 2A:
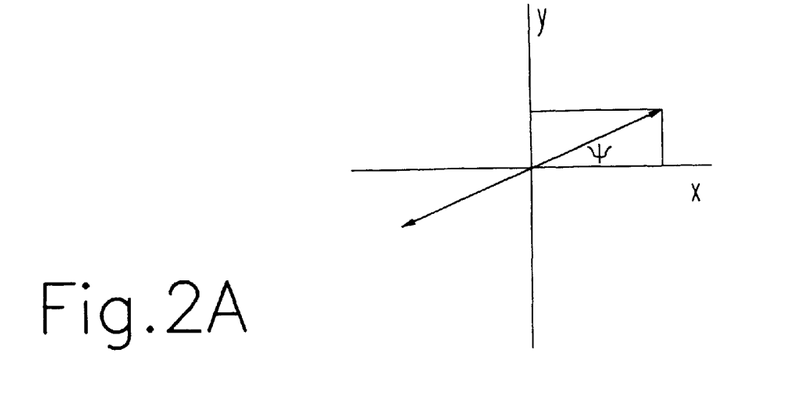
FIGS. 2A to 2C are diagrams respectively ilIlustrating various polarization distribution types of advancing light in accordance with the present invention.
Figure 2B:
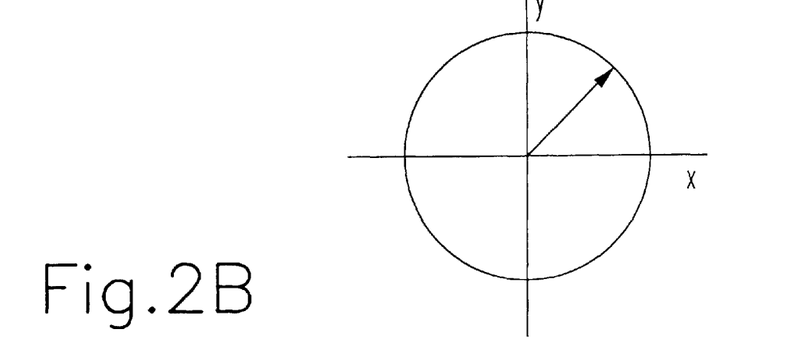
Figure 2C:
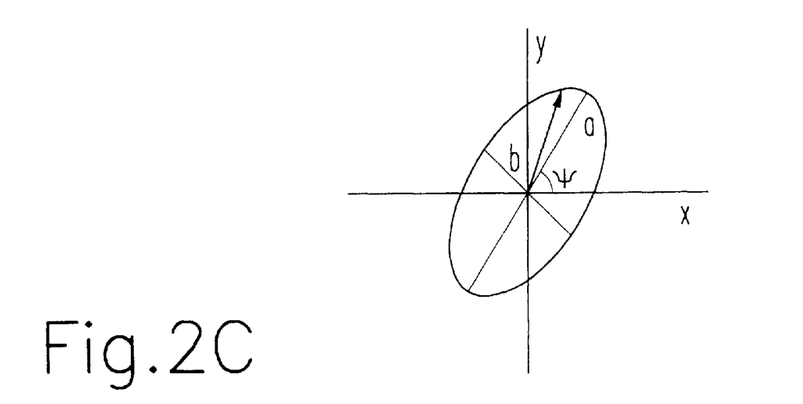

Using the above-mentioned equations (1) to (13), a polarization distribution function can be derived for any type of polarization including linear, circular and elliptical polarization types as shown in FIGS. 2A to 2C.

FIGS. 2A to 2C are diagrams respectively illustrating various polarization distribution types of advancing light.

As shown in FIGS. 2A to 2C, the polarization type is determined by the x and y-directional components of the polarized light incident on the entrance pupil. In other words, all polarization types can be expressed by the amplitude ratio and phase difference between the x and y-directional components.

After the polarization type of incident light is factorized by x and y-directional components, the following equations are obtained:

$$E_x(z,t) = E_{ox} \exp\{i(\tau+\delta_x)\}$$

$$E_y(z,t) = E_{oy} \exp\{i(\tau+\delta_y)\}$$

where, τ corresponds to "ωt−kz"(τ=ωt−kz), $E_{ox}$ and $E_{oy}$ represent the amplitude, and $\delta_x$ and $\delta_y$ represent phase in x and y directions, respectively.

Three polarization types respectively shown in FIGS. 2A to 2C are formed in accordance with the figure of the trace of the x and y-directional components $E_x(z,t)$ and $E_y(z,t)$ in a space.

When the x and y-directional components $E_x(z,t)$ and $E_y(z,t)$ expressed by the above equations have the same amplitude and phase, a linear polarization is obtained. When the x and y-directional components $E_x(z,t)$ and $E_y(z,t)$ have a phase difference of 90° and the same amplitude, a circular polarization is obtained. On the other hand, when the x and y-directional components $E_x(z,t)$ and $E_y(z,t)$ are different in both the phase and amplitude, an elliptical polarization is obtained.

In the case of the elliptical polarization, the coordinate system and beam travel path of the optical system are defined as in FIG. 2C.

The angle of inclination of the ellipse in accordance with the illumination method using the elliptical polarization is defined by the angle of polarization ψ. In this case, the ratio between the major and minor axes of the ellipse is defined by the ratio of ellipticity χ (tan$_\chi$-b/a). When ψ and χ are determined, the polarization distribution function ζ can be calculated for all polarization types.

The x, y and z-directional components of the polarization distribution function can be derived from the above-mentioned equation expressing the x and y-directional components of the light polarized after being incident on the mask, as follows:

$$\Psi_x(f,g) = \left[-gS_{com} + fP_{com}\{1-\lambda^2(f^2+g^2)\}^{1/2}\right] / [f^2+g^2]^{1/2} \quad (14)$$

$$\Psi_y(f,g) = \left[fS_{com} + gP_{com}\{1-\lambda^2(f^2+g^2)\}^{1/2}\right] / [f^2+g^2]^{1/2}$$

$$\Psi_z(f,g) = -\lambda P_{com}[f^2+g^2]^{1/2}$$

where, f and g represent spatial frequency components and define a meridional plane established by the optical axis and light beams advancing to the focal point.

The component perpendicular to the meridional plane is defined by an S-polarized component $S_{com}$ whereas the component parallel to the meridional plane is defined by a P-polarized component $P_{com}$.

When the polarized light having x and y-directional components entering the illumination mask is divided into S and P-polarized components $S_{com}$ and $P_{com}$ as follows:

$$S_{com} = \{fE_{oy}e^{i\delta} - gE_{ox}\}/\{f^2+g^2\}^{1/2} \quad (15)$$

$$P_{com} = \{fE_{ox} + gE_{oy}e^{i\delta}\}/\{f^2+g^2\}^{1/2} \quad (16)$$

Results obtained when the above calculation equations are applied to a practical illumination process will now be described in conjunction with FIG. 3.

Figure 3:
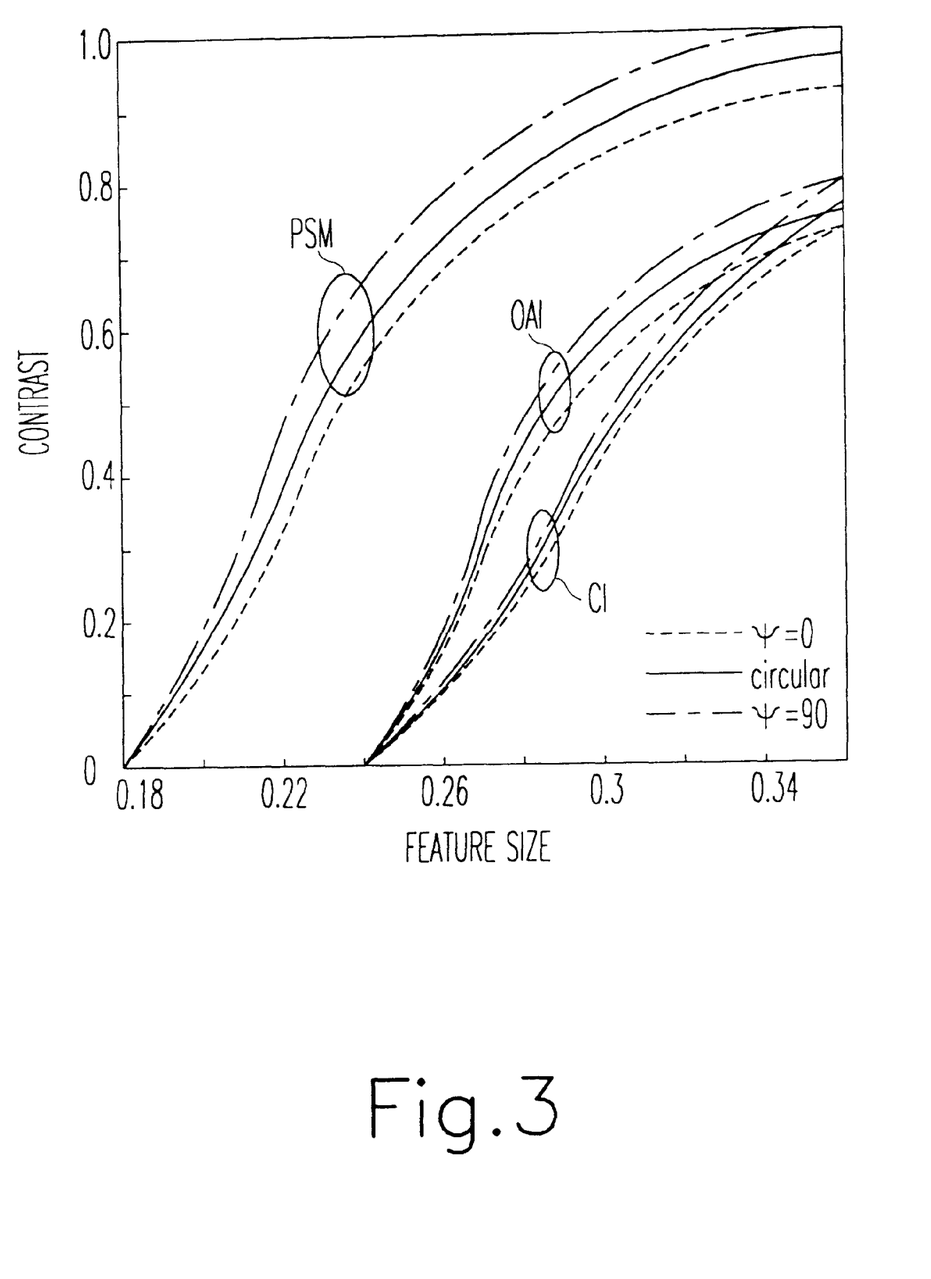
FIG. 3 illustrates graphs depicting a variation in contrast depending on a variation in feature size when line/space patterns are formed using the general illumination, off-axis illumination and circular polarization methods, respectively, in accordance with the present invention.

FIG. 3 illustrates graphs depicting a variation in contrast depending on a variation in feature size when line/space patterns are formed using the general illumination, off-axis illumination and circular polarization methods, respectively, in accordance with the present invention. In this case, the condition of i-line, NA =0.5 and σ=0.5 was used for each line/space pattern. In the case of using the value obtained from the circular polarization by the equations (14) to (16), the result was depicted by a solid line. In the case of using the linear polarization, the result was depicted by a phantom line.

By referring to FIG. 3, it can be found that when the circular polarization illumination is used for the cases respectively using the phase shift mask, off-axis illumination and general illumination, no contrast gap exists even though a degradation in contrast is exhibited as compared to the linear polarization when the angle of polarization ψ is 90°.

Figure 4:
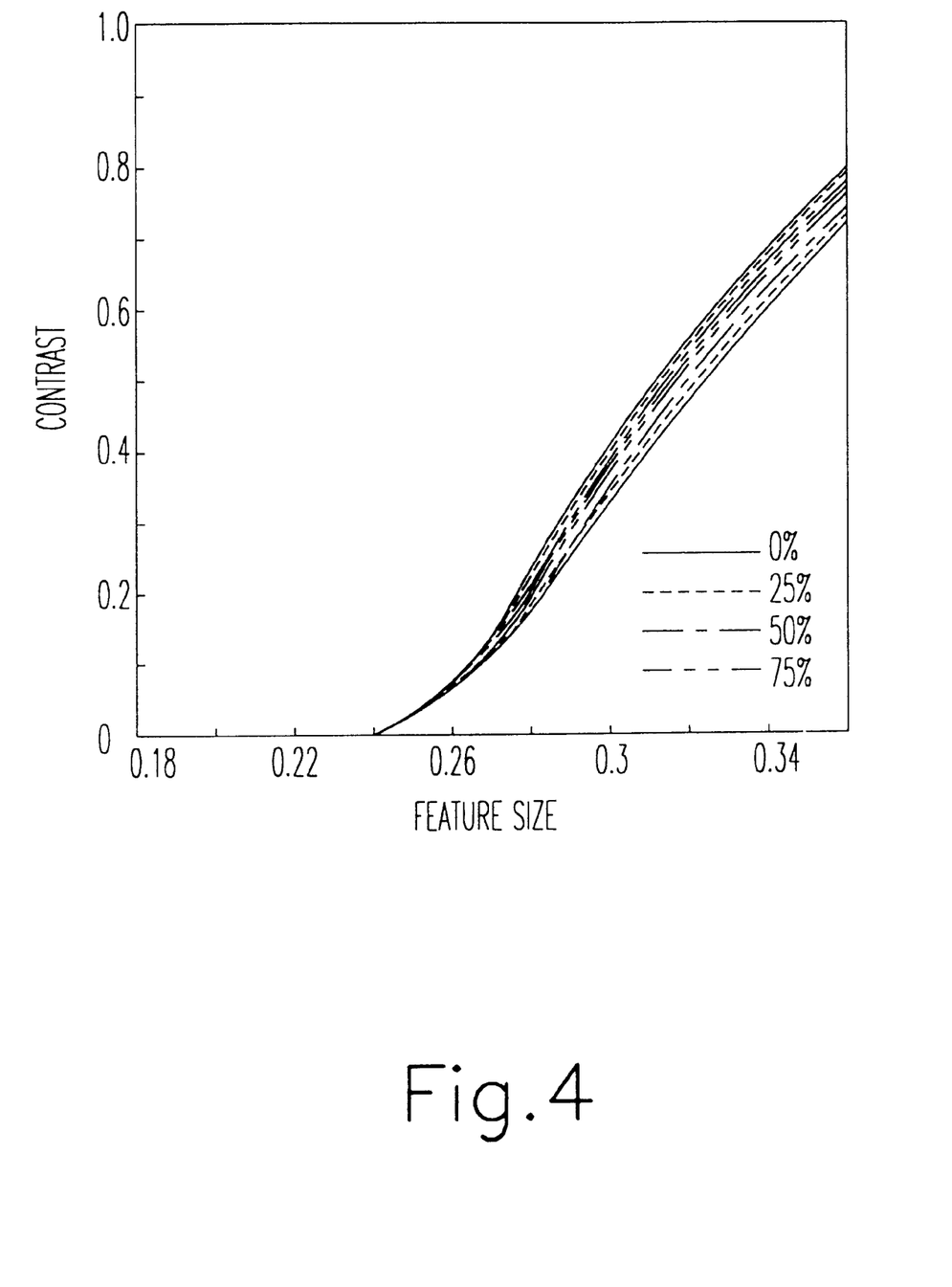
FIG. 4 illustrates graphs respectively depicting a variation in contrast depending on a variation in feature size when an illumination method according to an embodiment of the present invention is used at various ellipticities.

FIG. 4 illustrates graphs respectively depicting a variation in contrast and a variation in contract gap characteristically exhibited when the elliptical polarization illumination is used to form line/space patterns at various ellipticities (χ=100%, 75%, 50%, 25% and 0%) while fixing the angle of polarization ψ to 90° (namely, the major axis of the elliptical polarization is perpendicular to the mask pattern). In this case, the condition of i-line, NA=0.5 and σ=0.5 was used for each line/space pattern.

Referring to FIG. 4, as χ is higher, namely, when the ellipse approximates to the circle, the contrast gap is reduced.

Figure 5:
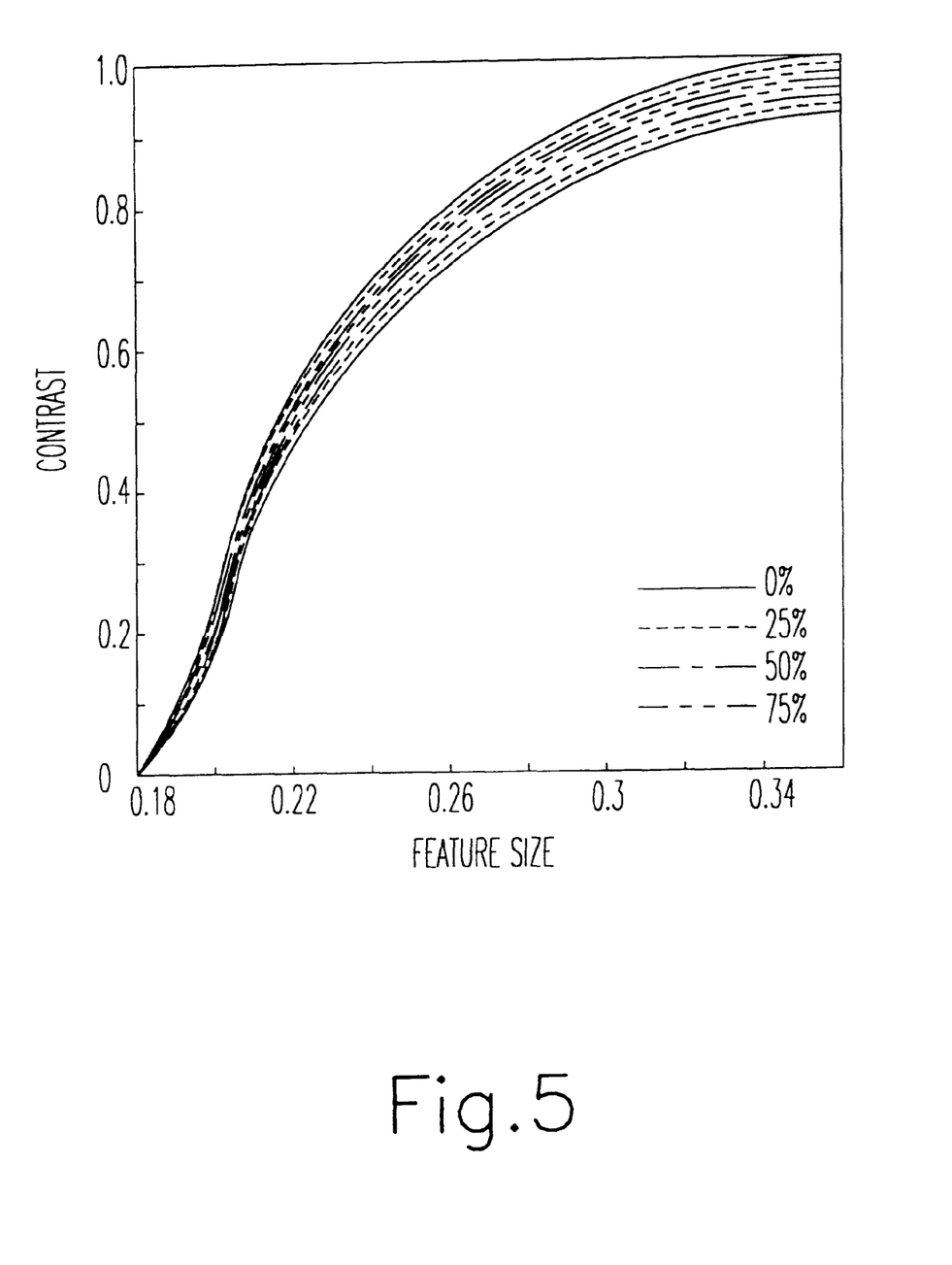
FIG. 5 illustrates graphs respectively depicting a variation in contrast depending on a variation in feature size when an illumination method according to another embodiment of the present invention is used at various ellipticities.

FIG. 5 illustrates graphs depicting a variation in characteristics exhibited when the elliptical polarization illumination is used along with a phase shift mask.

Referring to FIG. 5, the feature size is reduced as compared to the case using the general illumination mask as shown in FIG. 4.

Figure 6:
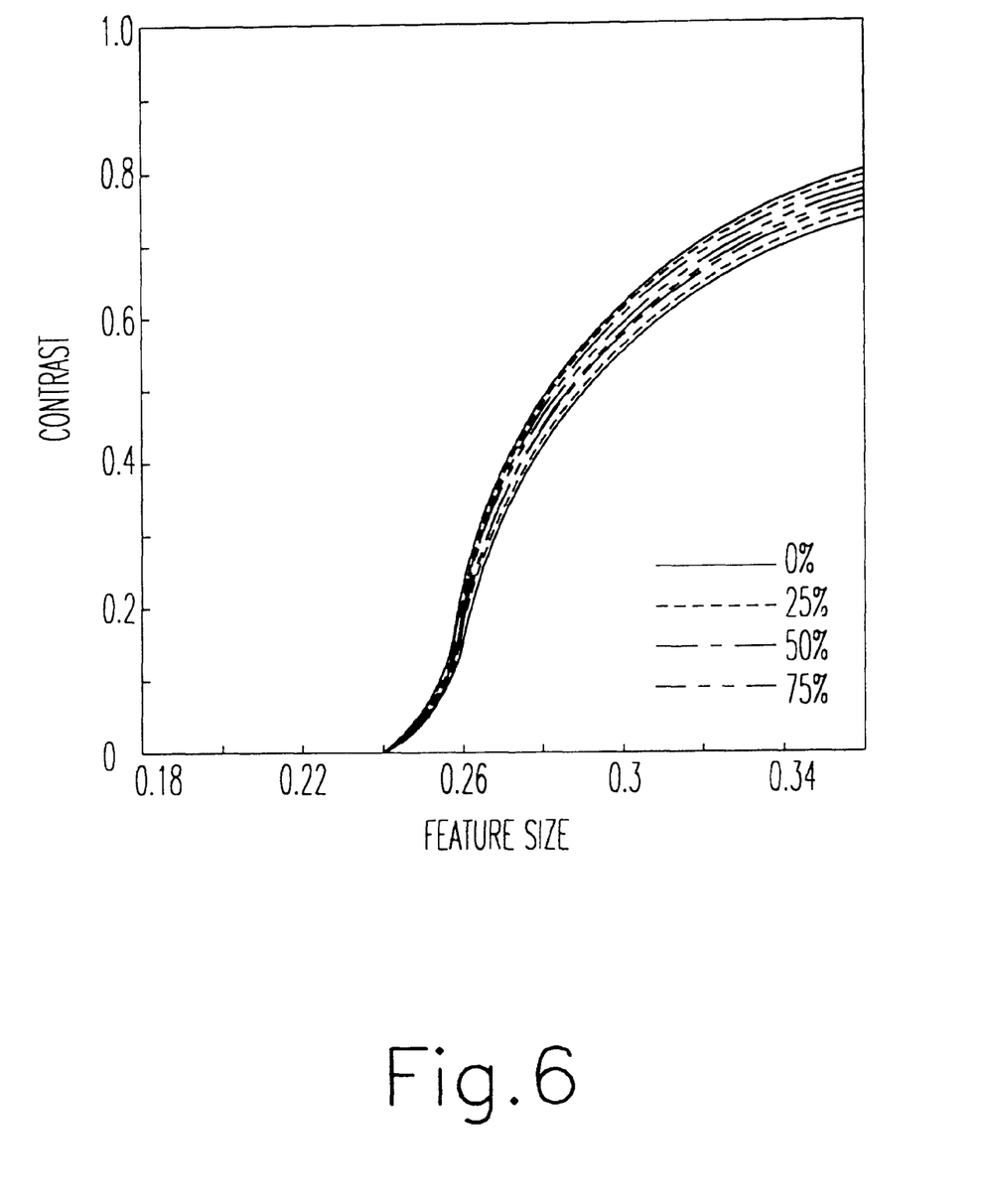
FIG. 6 illustrates graphs respectively depicting a variation in contract depending on a variation in feature size when an illumination method according to another embodiment of the present invention is used at various ellipticities.

On the other hand, FIG. 6 illustrates graphs respectively depicting a variation in characteristics exhibited when the elliptical polarization illumination and off-axis illumination methods ($\chi_{out}$=0.5, $\chi_{in}$=0.3) are used.

Referring to FIG. 6, the feature size is reduced as compared to the case of FIG. 4 while increased as compared to the case of FIG. 5.

As is apparent from the above description, the contrast can be determined by adjusting the angle of polarization of the elliptically polarized light. The contrast gap can be also determined by adjusting the ellipticity.

Accordingly, when the contrast and contrast gap allowable for the process are determined, it is possible to minimize the contrast gap while maintaining high contrast by selecting the optimum angle of polarization and ellipticity using the above-mentioned equations.

Thus, conventional i-line polarization illumination steppers can be used without any structural modification to form, on a wafer, a micro pattern image of about 0.18 μm grade essentially required for the fabrication of highly integrated semiconductor devices such as DRAMs of about 1 Giga grade.

In the case of a mask pattern consisting of a large part oriented in one direction and a small part oriented in various directions, it is possible to easily form a micro pattern by bringing the angle of polarization into coincidence with the main pattern direction while adjusting the ellipticity to the maximum value of allowable contrast gap.

Since optional values of the angle of polarization and ellipticity in elliptically polarized light are obtained when a polarization plate fabricated as desired is used, the effect of the present invention can be achieved only by arranging the polarization plate between the light source and aperture in conventional steppers.

As is apparent from the above description, the present invention provides the illumination method and apparatus used to form micro patterns, which can determine an ellipticity exhibiting optimum contrast gap and contrast by deriving a polarization distribution function by use of equations induced in accordance with the vector image theory and deriving S and P-polarized components $S_{com}$ and $P_{com}$ (these components are perpendicular to and parallel to a meridional plane, respectively) of polarized light having x and y-directional components entering an illumination mask, thereby preventing a contrast difference resulting from a contrast qap generated in the conventional linear polarization method, namely, an inconsistency between the longitudinal direction of the pattern and the polarization direction.

Accordingly, the illumination method and apparatus of the present invention enables easy use of appropriately elliptically polarized light, thereby being capable of achieving a reduction in contrast gap while achieving an improvement in contrast.

The illumination method and apparatus of the present invention can easily form micro patterns in the fabrication of semiconductor devices, thereby achieving a high integration of semiconductor devices.

The illumination method and apparatus of the present invention can increase the process margin, thereby improving yield, and reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An illumination method for forming a pattern on a wafer by irradiating an image onto the wafer using a light source, the method comprising:

providing an elliptically-polarized light as the light source;

adjusting an angle of polarization of the elliptically-polarized light which determines a contrast; and adjusting a ratio of ellipticity of the elliptically-polarized light which determines a contrast gap;

so as to optimize the contrast and the contrast gap of the image that is irradiated onto the wafer.

2. The method of claim 1, wherein the angle of polarization and the ratio of elipticity of the elliptically-polarized light are calculated by:

$$\Psi_x(f, g) = \frac{-gS_{com} + fP_{com}\sqrt{1-\lambda^2(f^2+g^2)}}{\sqrt{(f^2+g^2)}}$$

$$\Psi_y(f, g) = \frac{fS_{com} + gP_{com}\sqrt{1-\lambda^2(f^2+g^2)}}{\sqrt{(f^2+g^2)}}$$

$$\Psi_z(f, g) = -\lambda P_{com}\sqrt{f^2+g^2}$$

wherein:

$\psi_x(f,g)$, $\psi_y(f,g)$ and $\psi_z(f,g)$ are respective x, y and z components of a polarization distribution function $\psi(f, g)$ of light incident on a mask;

f and g are spatial frequency components;

$\lambda$ is a wavelength;

$$S_{com} = \frac{fE_{oy}e^{i\delta} - gE_{ox}}{\sqrt{f^2+g^2}}$$

$$P_{com} = \frac{fE_{ox} + gE_{oy}e^{i\delta}}{\sqrt{f^2+g^2}}$$

$S_{com}$ and $P_{com}$ are respective S-polarized and P-polarized components that are respectively perpendicular to and parallel to a meridional plane;

$E_{ox}$ and $E_{oy}$ represent respective amplitudes in x and y directions; and $\delta_x$ and $\delta_y$ represent respective phases in x and y directions.

* * * * *